(12) United States Patent
Bullock et al.

(10) Patent No.: US 7,580,807 B2
(45) Date of Patent: Aug. 25, 2009

(54) TEST PROTOCOL MANAGER FOR MASSIVE MULTI-SITE TEST

(75) Inventors: Matthew Craig Bullock, Irving, TX (US); Alessandro Paglieri, Richardson, TX (US); Jayashree Saxena, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/761,440

(22) Filed: Jun. 12, 2007

(65) Prior Publication Data

US 2008/0015798 A1    Jan. 17, 2008

Related U.S. Application Data

(60) Provisional application No. 60/938,408, filed on May 16, 2007, provisional application No. 60/804,910, filed on Jun. 15, 2006.

(51) Int. Cl.
 *G01R 31/26* (2006.01)
(52) U.S. Cl. ................................ 702/117; 324/765
(58) Field of Classification Search ............. 702/117; 324/765
See application file for complete search history.

(56) References Cited

U.S. PATENT DOCUMENTS 5,592,493 A     1/1997  Crouch et al.
6,125,464 A *   9/2000  Jin .............................. 714/727
6,836,865 B2   12/2004  Kusko
6,988,228 B2 *  1/2006  Paglieri ....................... 714/726
6,988,232 B2    1/2006  Ricchetti et al.
7,036,060 B2 *  4/2006  Nakao et al. ................. 714/726
7,183,789 B2    2/2007  Whetsel

OTHER PUBLICATIONS

Whetsel, Lee D.; "Device Testing Architecture, Method and System"; U.S. Appl. No. 11/762,893, filed Jun. 14, 2007.
Whetsel, Lee D.; "Scan Frame Based Test Access Mechanisms"; U.S. Appl. No. 11/694,115, filed Mar. 30, 2007.

* cited by examiner

*Primary Examiner*—Drew A Dunn
*Assistant Examiner*—Hien X Vo
(74) *Attorney, Agent, or Firm*—Yingsheng Tung; Wade J. Brady, III; Frederick J. Telecky, Jr.

(57) ABSTRACT

Disclosed herein is a massive multi-site (MMS) testing architecture. The MMS architecture includes a MMS interface on each of a plurality of devices under test. The MMS interface includes a test protocol manager that may receive test stimulus and send the test stimulus to cores of the device under test. The test protocol manager may receive test responses from cores of the device under test and generate test comparisons based on comparisons between the test responses and expected responses. The test protocol manager may store the test comparisons on the device under test and communicate the stored test comparisons to automated test equipment (ATE) upon being queried by the ATE. The device under test may send the test comparisons to the ATE over a low-bandwidth communication.

12 Claims, 6 Drawing Sheets

TEST PROTOCOL MANAGER FOR MASSIVE MULTI-SITE TEST

CROSS-REFERENCE TO RELATED APPLICATIONS

This application claims priority to U.S. Provisional Application Ser. No. 60/804,910, filed Jun. 15, 2006, titled "Test Protocol Manager for Massive Multi-Site Test," and U.S. Provisional Application Ser. No. 60/938,408, filed May 16, 2007, titled "Test Protocol Manager for Massive Multi-Site Test," both of which are incorporated by reference herein as if reproduced in full below.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Similar to modern software development, the efficient creation of complex system-on-chip (SOC) designs relies on reuse of pre-designed intellectual property (IP) components. These pre-designed IP components are often referred to as cores. A core may be combined with other cores to develop more complex SOC designs. To support testing of the SOC designs, each core may have a wrapper that isolates the core from SOC design. The wrapper enables the core to be tested independently from the SOC design in which it is used.

A test access mechanism (TAM) may be embedded on the SOC to communicate test patterns and test responses between the input/output (I/O) pins of the SOC design and the core wrappers. IEEE 1500 defines a standard architecture for enabling the testing of cores in a SOC design. The core test language (CTL) defined in the IEEE 1500 standard describes the wrappers, the test patterns, and the test responses for testing cores. The TAM may receive the test patterns from and communicate the test responses to an automated test equipment (ATE). The ATE may be used to test multiple devices in parallel by supplying the test patterns and receiving the test responses from each of the multiple devices. The ATE may then compare the test responses with expected responses to generate the results of the test.

Testing multiple devices in parallel enables a reduction in testing costs while maximizing the production capacity of the devices. As the number of devices to be tested in parallel increase, the computational resources required by the ATE to perform the communications and comparison operations similarly increases. Also, the total bandwidth of communication between the ATE and the multiple devices increases with the number of devices being tested in parallel.

SUMMARY

In one aspect, the disclosure includes a device under test. The device under test is comprised of a digital intellectual property design including a plurality of cores and an interface. The interface is configured to provide test stimulus to one or more of the plurality of cores and generate test comparisons based on test responses generated by the one or more of the plurality of cores and expected test responses.

In another aspect, the disclosure includes a method of testing a device under test. The method comprises receiving test stimulus and expected test responses and testing one or more cores of the device under test in accordance with the test stimulus. The test responses from the one or more cores and the expected test responses are compared on the device under test. The results of the comparisons are stored on the device under test.

In a third aspect, the disclosure includes a testing architecture. The testing architecture comprises a test equipment configured to send test stimulus and receive test comparisons. An interface coupled to the test equipment is configured to send the test stimulus on a downlink communication and receive the test comparisons on an uplink communication. A device under test coupled to the interface is configured to receive the test stimulus from the downlink communication and send the test comparisons on the uplink communication. The device under test is further configured to perform tests in accordance with the test stimulus and compare results of the tests with expected results of the tests to generate the test comparisons.

These and other features will be more clearly understood from the following detailed description taken in conjunction with the accompanying drawings and claims.

BRIEF DESCRIPTION OF THE DRAWINGS

For a more complete understanding of this disclosure, reference is now made to the following brief description, taken in connection with the accompanying drawings and detailed description, wherein like reference numerals represent like parts.

DETAILED DESCRIPTION

It should be understood at the outset that although an illustrative implementation of one or more embodiments are provided below, the disclosed systems and/or methods may be implemented using any number of techniques, whether currently known or in existence. The disclosure should in no way be limited to the illustrative implementations, drawings, and techniques illustrated below, including the exemplary designs and implementations illustrated and described herein, but may be modified within the scope of the appended claims along with their full scope of equivalents.

Disclosed herein is a massive multi-site (MMS) testing architecture. The MMS architecture includes a MMS interface on each of a plurality of devices under test. The MMS interface includes a test protocol manager that receives packets from an automated test equipment (ATE). The test protocol manager may decode the packets to send test stimulus to cores of the device under test.

The test protocol manager may receive test responses from cores of the device under test and generate test comparisons based on comparisons between the test responses and expected responses. Performing the test comparisons on each device under test reduces the computational burden of the ATE by freeing the ATE from performing potentially thousands of compare operations every test cycle. The test protocol manager may store the test comparisons in an internal memory on the device under test.

The test protocol manager may also store diagnostic data of the device under test in the internal memory. Diagnostic data may include data collected upon detecting a test failure that may be used to identify which portion of the device under test is failing and may also be used to determine appropriate solutions for correcting the failure. Diagnostic data may be collected from one or more sources on the device under test.

Each of the devices under test may maintain the test comparisons and the diagnostic data in internal memories and communicate the test comparisons and diagnostic data to the ATE. Upon being queried by the ATE, a device under test may retrieve the test comparisons and the diagnostic data from the internal memory of the device under test and send the retrieved data to the ATE over a low-bandwidth communication. Storing the test comparisons and the diagnostic data in memories on the devices under test enables the ATE to receive data from less than all of the devices under test. Therefore the bandwidth of communication between the ATE and the devices under test may be less than the bandwidth needed to communicate the test comparisons and diagnostic data in real time. Further, storing the test comparisons and the diagnostic data in memories on the devices under test enables a consolidated location for storing multiple types of testing data that may be used by the ATE.

Figure 1:
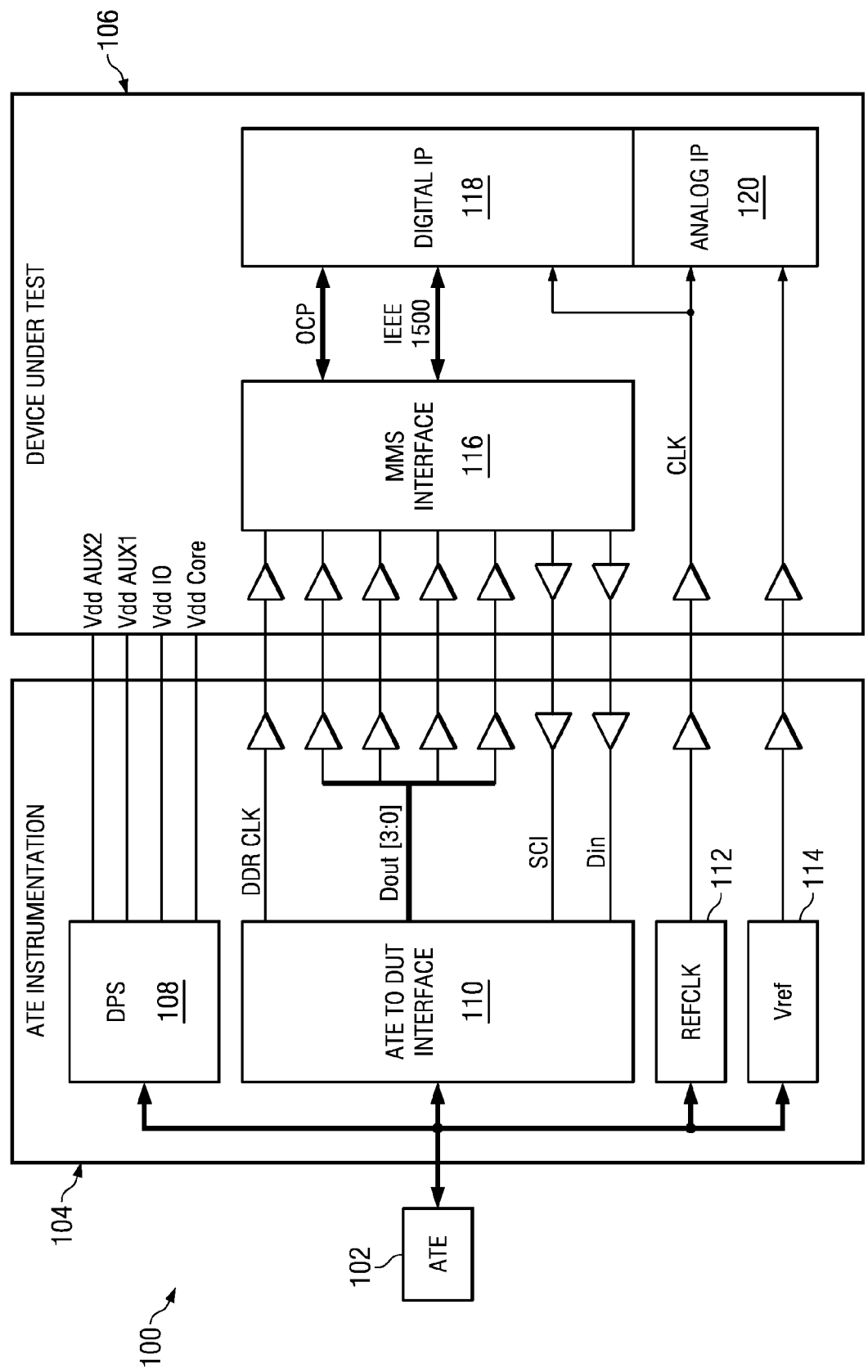
FIG. 1 illustrates an exemplary massive multi-site architecture according to an embodiment of the disclosure.

FIG. 1 illustrates an exemplary massive multi-site (MMS) architecture 100 according to an embodiment of the disclosure. The MMS architecture 100 includes an automated test equipment (ATE) 102, an ATE instrumentation 104, and a device under test (DUT) 106. The ATE 102 drives stimulus for testing the DUT 106, stores test comparisons received from the DUT 106, and analyzes the test comparisons to determine whether the DUT 106 has tested successfully. For example, the ATE 102 may act as or utilize an automatic test pattern generator (ATPG) to generate and communicate test patterns on scan chains for testing the DUT 106. Analysis of the test comparisons may include displaying the test comparisons, filtering the test comparisons to only identify the DUT 106 with failed test comparisons, or perform any other analysis method persons of ordinary skill in the art would recognize.

The ATE instrumentation 104 enables communication between the ATE 102 and the DUT 106. The ATE instrumentation 104 includes a device power supply (DPS) 108, an ATE-to-DUT interface 110, a reference clock (REFCLK) 112, and an analog interface (VREF) 114. The DPS 108 may provide four low current switchable power supplies with measurement capability for the DUT 106. The power supplies may include an input/output (I/O) power supply, a core power supply, and two auxiliary power supplies. The limitation of only four power supplies may lead to some designs which gang power domains together during testing. In some embodiments, more or fewer power supplies may be provided to the DUT 106 from the DPS 108. The REFCLK 112 may be a free running clock source that may be used to provide a clock reference to digital circuits on the DUT 106. The REFCLK 112 may also feed analog structures on the DUT 106 where sine-wave sources may be needed. VREF 114 may supply a single differential pair to the DUT 106 to provide an analog source, such as a sine wave. VREF 114 may also be used to drive and measure analog functions.

The ATE-to-DUT interface 110 may include a downlink for communicating stimulus to the DUT 106 and an uplink for receiving test comparisons from the DUT 106. The communication between the ATE-to-DUT interface 110 and the DUT 106 may be asymmetric. More bandwidth may be required for downlink communication in order to carry all the information that the DUT 106 may need in order to perform tests and compare results of the tests with expected results. For example, the ATE-to-DUT interface 110 may communicate test stimulus data, expected test result data, and mask data to the DUT 106. Because the test comparisons are performed on the DUT 106 as discussed in detail below, less bandwidth may be required for the uplink communication. For example, the DUT 106 may simply communicate the results of the test comparisons as a serial bit indicating whether tests have either passed or failed.

The downlink communication may include five outputs to the ATE-to-DUT interface 110, including a double data rate clock (DDR CLK) output and four data outputs (Dout [3:0]). Utilizing the double data rate clock enables data on the four data outputs to be communicated on both phases of the double data rate clock. For example, when the double data rate clock is low, a bit of data may be communicated over each of the four data outputs. When the double data rate clock is high, another bit of data may be communicated over each of the four data outputs. The downlink communication may therefore communicate eight bits, or a byte, of data every clock cycle. The uplink communication may be comprised of two inputs to the ATE-to-DUT interface 110, including a serial clock input (SCI) and a data input (Din).

The DUT 106 may perform tests on the DUT 106 according to the stimulus provided over the ATE-to-DUT interface 110 and compare results of the tests with expected responses of the tests. The DUT 106 may store the results of the test comparisons and communicate the test comparisons to the ATE 102 upon receiving a request for the test comparisons. While only one DUT 106 is illustrated, persons of ordinary skill in the art will recognize that a plurality of devices may be tested in parallel. In particular, the disclosure provides a massive multi-site interface on each device to enable parallel testing of one or more devices up to hundreds or a thousand or more devices. While the term massive is used in conjunction with the multi-site interface described herein, massive is not intended to assign a particular number or range of numbers of devices that may be tested in parallel. Rather, the term massive is used herein to denote that the multi-site interface described herein may enable testing of one or more devices in parallel. For the purposes of clarity the operations and communications of a single DUT 106 will be described, however, one skilled in the art will recognize that the description of the DUT 106 may be applied to all of the devices being tested in parallel.

The DUT 106 includes a massive multi-site (MMS) interface 116, digital intellectual property (IP) 118, and analog IP 120. The digital IP 118 may include a plurality of cores, or reusable pre-designed blocks of hardware with known functions, that are interconnected to create a system-on-chip (SoC) design. Each of the cores may include a wrapper that isolates the core from the SoC environment such that each core may be independently tested. The analog IP 120 may include analog mixed-signal (AMS) and/or radio-frequency (RF) structures.

The digital IP 118 may include one or more built-in self test (BIST) controllers for testing memory components of one or more of the cores. Each core of the digital IP 118 may have none, one, or more BIST controllers for testing the memory components of the core. Each BIST controller may test the memory components of a core of the digital IP 118 by performing a test algorithm including a sequence of read and write operations to the memory components. For example, the BIST controller may write a pattern of bits into the memory components of a core and subsequently read out the contents of the memory components of the core. The BIST controller may compare the pattern of bits read out from the memory components on the core to the pattern of bits written into the memory components of the core to detect differences in the patterns of bits. The BIST controllers may each be coupled to an open core protocol (OCP) bus to communicate data of comparison failures as diagnostic data to the MMS interface 116. The MMS interface may store the diagnostic data in an internal memory. While the BIST controllers were described as performing testing of memory components of the cores, persons of ordinary skill in the art will recognize that the BIST controllers may perform other types of testing on the cores.

The diagnostic data recorded by the BIST controllers may be used by the ATE 102 to identify failed components of the DUT 106 and to perform repair operations to fix the failures. For example, the ATE 102 may be used to perform a memory repair upon receiving diagnostic data of memory component failure. Memory components of the DUT 106 may have built-in redundancy that may be accessed by blowing fuses on the DUT 106. The memory repair may include accessing redundant memory components to take the place of a failed memory component upon receiving diagnostic data indicative of the failed memory component.

The MMS interface 116 may receive data from the downlink communication of the ATE-to-DUT interface 110. The MMS interface 116 may reduce and decode the data received from the downlink communication. The decoded data may control the operation of the MMS interface 116 or provide test stimulus over an Institute of Electrical and Electronics Engineers (IEEE) 1500 communication interface for testing the digital IP 118 and some or all of the analog IP 120 as discussed in detail below. The decoded data may also provide expected test responses. The MMS interface 116 may generate test comparisons based on the expected test responses and test responses received from the digital IP 118 and the analog IP 120 over the IEEE 1500 communication interface. The MMS interface 116 may store the test comparisons on an internal memory of the MMS interface 116. The decoded data may control the MMS interface 116 to record the diagnostic data received from the BIST controllers via the OCP bus. The decoded data may control the MMS interface 116 to read out the diagnostic data and the test comparisons from the internal memory and supply the diagnostic data and test comparisons to the ATE 102 via the uplink communication of the ATE-to-DUT interface 110.

Figure 2:
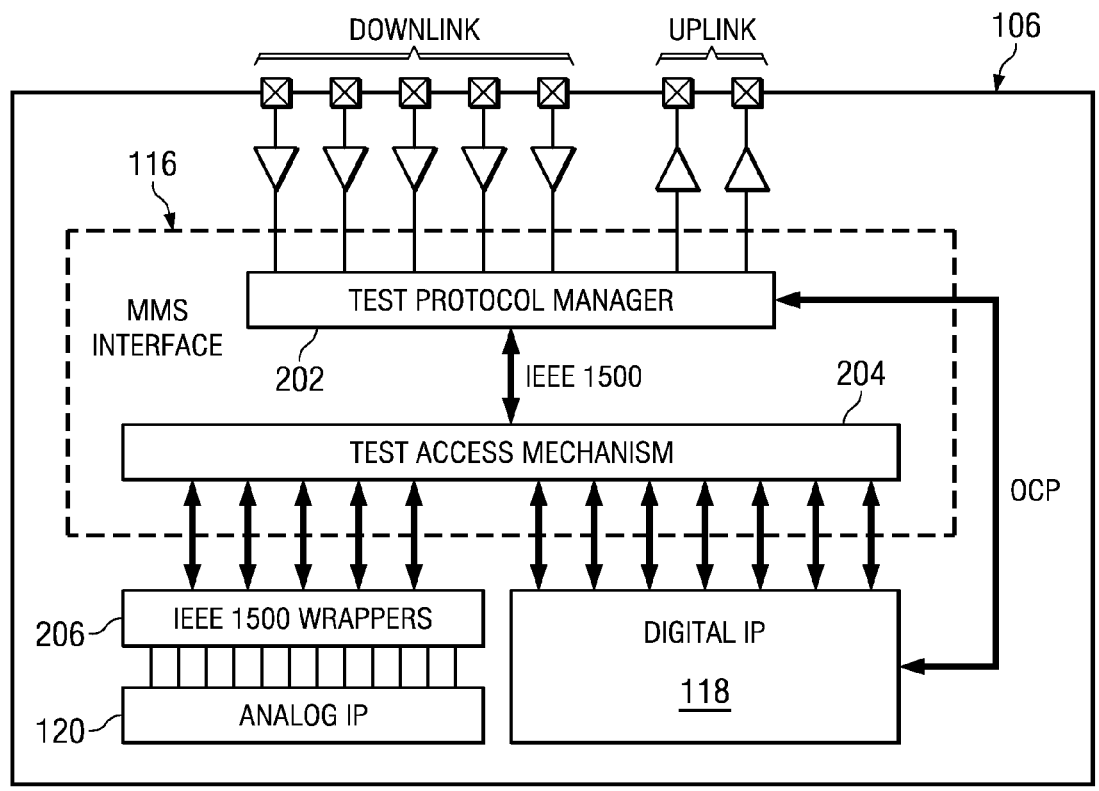
FIG. 2 illustrates an exemplary massive multi-site interface according to an embodiment of the disclosure.

FIG. 2 illustrates an exemplary MMS interface 116 according to an embodiment of the disclosure. The MMS interface 116 includes a test protocol manager (TPM) 202 and a test access mechanism (TAM) 204. The TPM 202 may operate in a functional mode and a setup mode. Configuration and programming of the TPM 202 may be performed during the setup mode. The TPM 202 may operate to perform all of the reducing, decoding, comparison, and communication operations described above. A detailed discussion of the operations of the TPM 202 in the functional mode is provided below.

The TAM 204 may receive test stimulus from the TPM 202 over an IEEE 1500 communication interface. The TAM 204 may provide interfaces for communicating the test stimulus to some or all of the cores in the digital IP 118. As the analog resources provided to the DUT 106 may only include the VREF 114, testing of the analog IP 120 may be enabled through digital interfacing provided by IEEE 1500 wrappers 206. The TAM 204 may provide test stimulus to the analog IP 120 through the IEEE 1500 wrappers 206. A detailed discussion of exemplary implementations and operations of the TPM 202 and the TAM 204 follows.

Figure 3:
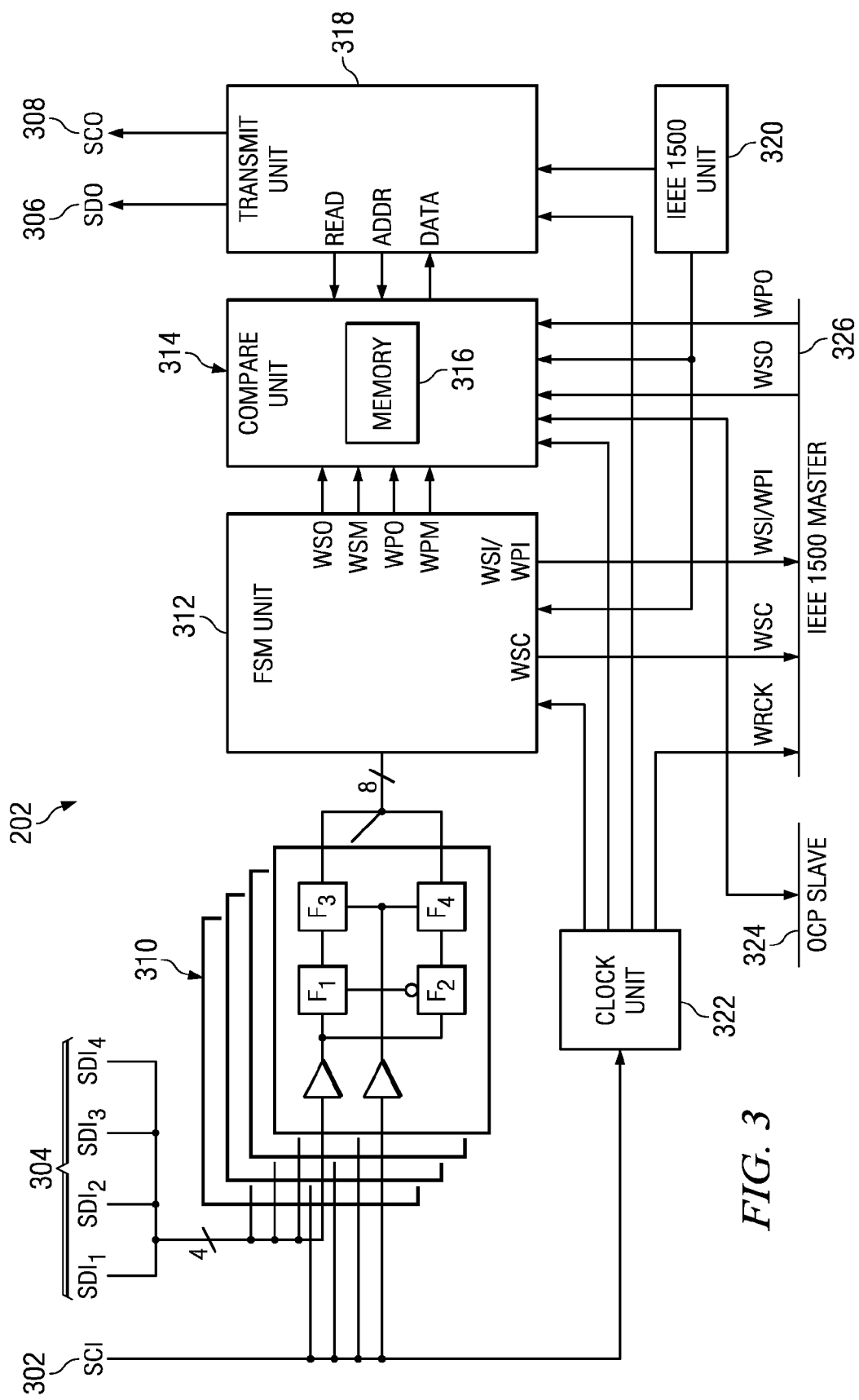
FIG. 3 illustrates an exemplary test protocol manager according to an embodiment of the disclosure.

FIG. 3 illustrates an exemplary TPM 202 according to an embodiment of the disclosure. The TPM 202 includes reducing units 310, a finite state machine (FSM) unit 312, a compare unit 314, a transmit unit 318, an IEEE 1500 unit 320, and a clock unit 322. The reducing units 310 may extract double data rate input to the TPM 202. The FSM unit 312 may control the operation of the TPM 202. The compare unit 314 may perform test comparisons between test response data and expected response data and store the test comparisons on a memory 316. The compare unit 314 may also enable data logging of diagnostic data received over an OCP slave bus 324 to the memory 316. The transmit unit 318 may communicate data via the uplink communication of the ATE-to-DUT interface 110. The IEEE 1500 unit 320 may enable formatting of data and communication in compliance with the IEEE 1500 standard. The clock unit 322 may supply clock signals for various units of the TPM 202. A detailed discussion of each of the units of the TPM 202 and the operation of the TPM 202 follows.

Figure 4:
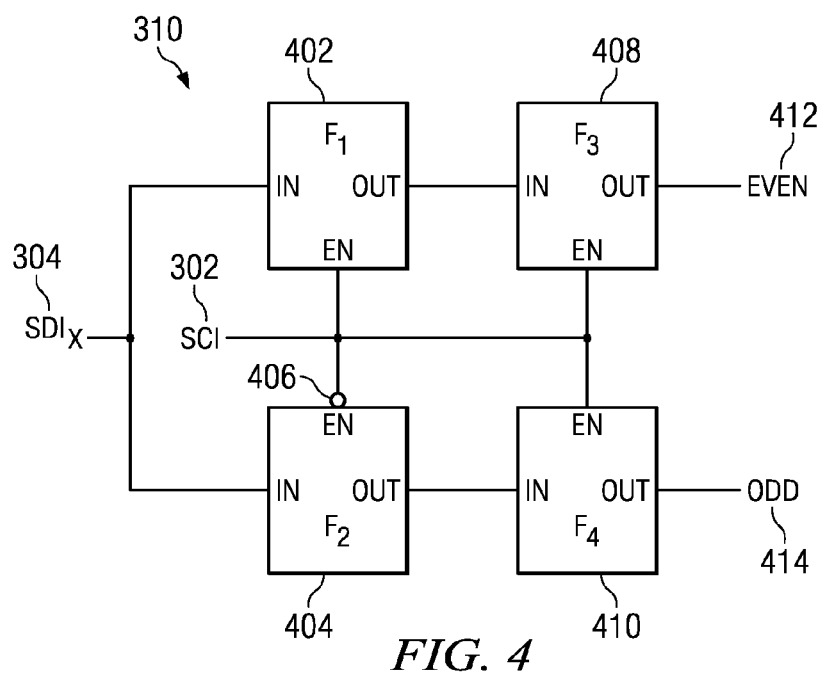
FIG. 4 illustrates an exemplary reducing unit according to an embodiment of the disclosure.

The TPM 202 may receive data from the ATE 102 via the downlink communication of the ATE-to-DUT interface 110. The TPM 202 may receive the data on a serial clock input (SCI) 302 and four serial data inputs including $SDI_1$, $SDI_2$, $SDI_3$, and $SDI_4$, collectively referred to as a serial data input (SDI) 304. As discussed above, the SCI 302 may be a double data rate clock such that data is received over the SDI 304 on both phases of the SCI 302. As used herein, a beat refers to one clock cycle of the double data rate SCI 302. With the SDI 304 including four inputs, and each input receiving a bit of data for each phase of the SCI 302, then the TPM 202 may receive eight bits, or a byte, of data every beat of the SCI 302. In order to extract each of the eight bits of data from the SDI 304 each input of the SDI 304 may be provided to one of a plurality of reducing units 310. In the exemplary embodiment illustrated in FIG. 3, there are four of the reducing units 310 to correspond with each of the four data inputs of the SDI 304. The SCI 302 may be provided to all of the reducing units 310. An exemplary implementation of the reducing units 310 is shown in FIG. 4 and discussed in detail below.

The byte of data extracted by the reducing units 310 every beat of the SCI 302 may be input to the FSM unit 312. The FSM unit 312 may decode the data as an instruction for performing an operation within the TPM 202 or as an IEEE 1500 operation including control data and input data. The FSM unit 312 may send the IEEE 1500 operations to the TAM 204 over an IEEE 1500 master interface 326 for testing the digital IP 118 and the analog IP 120. The FSM unit 312 may also decode the data as expected test responses and masks that may be communicated to the compare unit 314.

The compare unit 314 may receive test responses from the TAM 204. The test responses may be provided to the compare unit 314 through a single bit wrapper serial output (WSO) and eight bits of a wrapper parallel output (WPO) received from the IEEE 1500 master interface 326. The compare unit may perform comparison operations using the expected test responses and masks received from the FSM unit 312 and using the test responses received over the IEEE 1500 master interface 326. The expected test responses may be provided to the compare unit 314 through a single bit WSO and eight bits of a WPO received from the FSM unit 312. Similarly, the masks may be provided to the compare unit 314 through a single bit wrapper serial mask (WSM) and eight bits of a wrapper parallel mask (WPM) from the FSM unit 312. The compare unit 314 may store the results of the comparison operations as test comparisons in the memory 316. The compare unit 314 may also enable receiving diagnostic data from the BIST controllers over the OCP slave bus 324 and storing the diagnostic data in the memory 316.

Table 1 shows how the bits of test response, bits of the expected test response bits, and bits of the mask may be utilized by the compare unit 314 to generate test comparisons according to an embodiment of the disclosure. Table 1 also shows how the test comparisons may be stored in the memory 316.

TABLE 1

| Test Response | Expected Response | Mask | Test Comparison | Description |
|---|---|---|---|---|
| 0 | x | 1 | 00 | Sample 0 |
| 1 | x | 1 | 01 | Sample 1 |
| 0 | 0 | 0 | 00 | Sample 0 |
| 0 | 1 | 0 | 10 | Sample 0-Expect 1 |
| 1 | 0 | 0 | 11 | Sample 1-Expect 0 |
| 1 | 1 | 0 | 01 | Sample 1 |

As shown in Table 1, test comparisons may be stored in memory 316 as two bit sequences for each comparison. The first bit in the test comparison may indicate that a successful comparison was performed by the compare unit 314. The second bit in the test comparison may indicate a value of the bit sampled from the IEEE 1500 master interface 326. For example, a test comparison value of "00" may indicate that a successful comparison was performed and a value of "0" was sampled from the IEEE 1500 master interface 326. Similarly, a test comparison value of "10" may indicate that an unsuccessful comparison was performed and a value of "0" was sampled from the IEEE 1500 master interface 326. An unsuccessful comparison may indicate that a test response sampled from the IEEE 1500 master interface 326 does not match an expected test response sampled from the FSM unit 312.

If a mask bit is set to one, then a comparison may not be performed by the compare unit 314. For example, when a test response received over the IEEE 1500 master interface 326 is zero and a corresponding mask bit is one, then the expected test response received from the FSM unit 312 may be ignored and a successful test comparison may be generated corresponding to the value sampled from the IEEE 1500 master interface 326.

Table 2 shows an exemplary comparison operation performed by the compare unit 314.

TABLE 2

| Description | WS | WP[7] | WP[6] | WP[5] | WP[4] | WP[3] | WP[2] | WP[1] | WP[0] |
|---|---|---|---|---|---|---|---|---|---|
| Test Responses | 0 | 1 | 1 | 0 | 1 | 0 | 0 | 1 | 0 |
| Expected Responses | 0 | 0 | 1 | 1 | 1 | 0 | 0 | 1 | 1 |
| Mask | 0 | 1 | 1 | 0 | 0 | 0 | 0 | 0 | 0 |
| Test Comparison | 00 | 01 | 01 | 10 | 01 | 00 | 00 | 01 | 10 |

The first column of Table 2 provides a description of the bits contained in each of the rows. For example, the second row of Table 2 indicates that the bits contained in the second row correspond to the test responses that may be sampled from the IEEE 1500 master interface 326. The other columns of Table 2 describe which bits are being compared by the compare unit 312. For example, the bits under the second column of Table 2 correspond to the various wrapper serial bits including the WSO sampled from the IEEE 1500 master interface 326, the WSO sampled from the FSM unit 312, the WSM sampled from the FSM unit 312, and the resulting test comparison bits. Similarly, the bits under the third column of Table 2 correspond to the most significant bit in the parallel wrapper bits including the WPO[7] sampled from the IEEE 1500 master interface 326, the WPO[7] sampled from the FSM unit 312, the WPM[7] sampled from the FSM unit 312, and the resulting test comparison bits. As each of the nine test comparisons, including a test comparison for the WSO bit and eight test comparisons for each of the eight WPO bits, result in two bits of data then the compare unit 314 may write a total of eighteen test comparison bits to the memory 316 for each comparison operation.

The compare unit 314 may maintain two address pointers corresponding to the memory 316. A first address pointer, herein referred to as Address 1, may indicate a starting address for subsequent data retrieval from the memory 316. As the transmit unit 316 reads each line of data from the memory 316, the compare unit 314 may increment Address 1. A second address pointer, herein referred to as Address 2, may indicate an ending address for subsequent data retrieval from the memory 316. As each new line of comparison data is written into the memory 316, the compare unit may increment Address 2. When the transmit unit 316 is performing a data flush of the contents of the memory 316, the transmit unit 316 may start reading data from the memory 316 at the address pointed to by Address 1 and continue to read data from the memory 316 until Address 1 equals Address 2. The memory 316 may be configured as a closed loop memory. For example, if Address 2 is currently pointing to the last line in the memory 316, then when a new line of comparison data is written to the memory 316 Address 2 may be incremented such that Address 2 points to the first line in the memory 316.

The compare unit 314 may be configured to store test comparisons and diagnostic data in multiple data formats in the memory 316. Table 3 shows exemplary data formats that may be stored in the memory 316 when the memory 316 is implemented as a fifty-six bit memory.

TABLE 3

| Memory Configuration | CTYPE[1:0] | 4-Bit Field | 32-Bit Field | WPO[15:0] | WSO[1:0] |
|---|---|---|---|---|---|
| 1500 | 00 | 1111 | Global Counter | WPO | WSO |
| ATPG | 01 | ATYPE | ATPG Counter | WPO | WSO |
| BLIND OCP | 10 | | BIST Diagnostic Data | | |
| OCP | 11 | | Other Diagnostic Data | | |

The first column of Table 3 provides a description of each of the different data formats that may be stored in the memory 316. The other columns of Table 3 describe the various bits contained in each of the data formats. For example, under the CTYPE[0:1] field a value is shown for the two most significant bits in each memory format. As shown, each data format has a corresponding unique CTYPE[1:0] value to indicate which memory format is being used for each line in the memory 316.

As shown in Table 3, a first data format is an IEEE 1500 data format. The IEEE 1500 data format may record test comparisons in an IEEE 1500 mode of operation. The IEEE 1500 data format may be identified by the CTYPE[1:0] field with a value "00". Following the CTYPE[1:0] field, the IEEE 1500 data format includes a four bit field with a value "1111". The four bit field may further identify the data format as the IEEE 1500 data format. Following the four bit field, the IEEE 1500 data format includes a thirty-two bit global counter value. The value contained in the global counter value corresponds with a value contained in a global counter register (not shown) maintained on the TPM 202. The global counter register may maintain a count of a number of transfers communicated by the FSM unit 312 to the IEEE 1500 master interface 326. A detailed description of transfers is provided below. The global counter field identifies which stimulus out of a set of stimulus the test comparisons correspond to. Finally, the eighteen bits of the WPO[15:0] field and the WSO[1:0] field may be the eighteen test comparison bits described above.

A second data format for the memory 316 is an automatic test pattern generator (ATPG) data format. The ATPG data format may record diagnostic data of test comparisons in an ATPG testing mode of operation. The ATPG data format may be identified by the CTYPE[1:0] field with a value "01". Following the CTYPE[1:0] field, the ATPG data format includes a four bit field with an ATYPE value that may identify how an ATPG counter (not shown) is configured. Following the four bit ATYPE field, the ATPG data format includes a thirty-two bit value of the ATPG counter. Finally, the eighteen bits of the WPO[15:0] field and the WSO[1:0] field may be the eighteen test comparison bits described above.

Briefly, in the ATPG mode of operation, scan chains may be tested using test patterns. A scan chain may include one or more scan cells of the digital IP 118 linked together. For example, a scan chain may include a plurality of cores linked together. The digital IP 118 may be configured to include one or more scan chains for testing the DUT 106. Multiple scan chains may be tested simultaneously. Each scan chain may have a test pattern cycled through the scan cells of a scan chain. As the pattern is cycled through the scan cells, comparisons may be performed between expected data and data produced by the scan cells based on the test pattern.

The ATPG counter may be a thirty-two bit ATPG counter similar to the global counter described above. The thirty-two bit ATPG counter may be considered two counters including a pattern counter and a cycle counter depending on the configuration identified by the ATYPE value. The ATPG counter may be configured to allocate different numbers of bits to each of the pattern counter and the cycle counter. ATPG configurations may include range between a configuration with none or a few bits of the ATPG counter allocated to test patterns and all or many bits of the ATPG counter allocated to scan chains to a configuration with all or many bits of the ATPG counter allocated to test patterns and none or a few bits of the ATPG counter allocated to scan chains.

Table 4 shows exemplary allocations of bits in the ATPG counter in accordance with different values of the ATYPE filed.

TABLE 4

| ATYPE[3:0] | ATPG Counter | | | |
|---|---|---|---|---|
| | 31:24 | 23:16 | 15:8 | 7:0 |
| 0000 | | Pattern | | |
| 0001 or 1110 | | Pattern | | Cycle |
| 0011 or 1100 | Pattern | | Cycle | |
| 0111 or 1000 | Pattern | | Cycle | |
| 1111 | | Cycle | | |

As shown in Table 4, the bits of the ATPG counter may all be allocated to the pattern counter, the bits may all be allocated to the cycle counter, or the bits may be allocated as a combination of bits with some bits allocated to the pattern counter and a remaining number of bits allocated to the cycle counter. Briefly, the pattern counter may increment each time a test pattern has been communicated to the TPM 202. The cycle counter may be incremented as each packet of data is communicated to the TPM 202. A FRAME bit, described in detail below, may be received by the TPM 202 and used by the ATPG counter to increment each of the cycle counter and the pattern counter. For example, when the FRAME bit transitions from zero to one indicating the start of a scan chain, the cycle counter may increment. Each subsequent communication received by the TPM 202 with the FRAME bit set to one may also cause the cycle counter to increment. When the FRAME bit transitions from one to zero indicating the end of a scan chain, the pattern counter may increment.

Upon detecting a test comparison failure in the ATPG mode of operation, diagnostic data of test comparisons may be recorded in the memory 316 in the ATPG data format. The value of the cycle counter may identify which scan cell of a scan chain has failed. The value of the pattern counter may identify which test pattern was used to test the scan chain. As described above, multiple scan chains may be tested simultaneously. The eighteen test comparison bits of the WPO[15:0] and the WSO[1:0] described above may be used to identify which scan chain has failed. When testing multiple scan chains simultaneously, if one of the scan chains fails, the test comparison bits for all of the scan chains being tested may be stored in the memory 316. Recording the test results for all of the scan chains ensures that if multiple scan chains have failures that all of the failures may be recorded in the memory 316.

A third data format for the memory 316 is a blind OCP data format. The blind OCP data format may record diagnostic data received over the OCP slave bus 324 in a BIST data logging mode of operation. The blind OCP data format may be identified by the CTYPE[1:0] field with a value "10". Following the CTYPE[1:0] field, the blind OCP data format may include BIST diagnostic data. As described above, the BIST controllers may perform testing of memory components of the cores of the digital IP 118. Upon detecting a failure in the testing, a BIST controller may write the BIST diagnostic data to the OCP slave bus 324 for recording in the memory 316. The BIST diagnostic data may include an address of the memory component where the failure occurred, data contained in the memory component at the address, an identification of the BIST controller that detected the failure, and an identification of a test algorithm used by the identified BIST controller to detect the failure.

A fourth data format for the memory 316 is an OCP data format. The OCP data format may record various diagnostic data written to the memory 316 in a memory access mode. The OCP data format may be identified by the CTYPE[1:0] field with a value "11". Following the CTYPE[1:0] field, the blind OCP data format may include diagnostic data. The memory access mode may be used by various components of the DUT 106 to write diagnostic data to the memory 316. For example, a process may write diagnostic data to the OCP slave bus 324 for storage in the memory 316 using the memory access mode. As described above, the blind OCP data format and the OCP data format may be used for data logging of diagnostic data to the memory 316 that has been written to the OCP slave bus 324. The diagnostic data may include any data that may be used to identify a failed component of the DUT 106. The BIST diagnostic data may be used at the ATE 102 to perform repair operations to repair the failed component.

Figure 7:
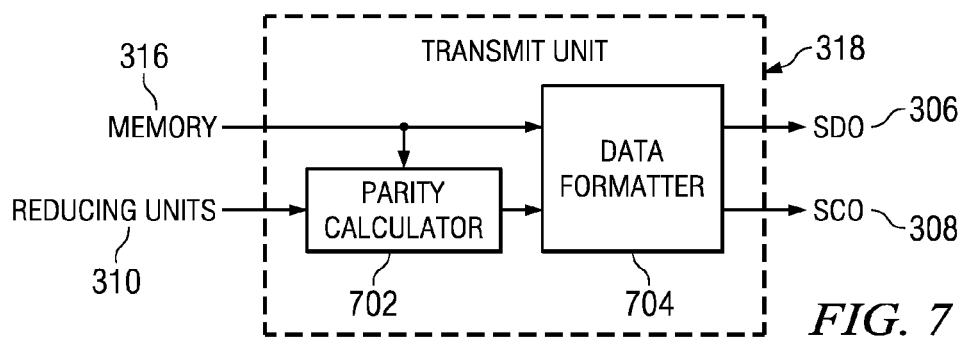
FIG. 7 illustrates an exemplary transmit unit of the test protocol manager according to an embodiment of the disclosure.

Looking back to FIG. 3, the transmit unit 318 may read the test comparisons and the diagnostic data from the memory unit 316 and communicate the test comparisons and the diagnostic data to the ATE 102 via the uplink communication of the ATE-to-DUT interface 110. The TPM 202 may send the data using a serial clock output (SCO) 308 and a serial data output (SDO) 306. The clock unit 322 may receive the SCI 302 as a reference clock to produce clock signals for each of the other units on the TPM 202. The clock unit 322 may also supply a wrapper clock (WRCK) to the IEEE 1500 master interface 326 to supply a clock signal to the TPM 204. An exemplary implementation of the transmit unit 318 is shown in FIG. 7 and discussed in detail below.

FIG. 4 illustrates an exemplary implementation of one of the reducing units 310 according to an embodiment of the disclosure. The reducing unit receives the SCI 302 and one of the SDI 304, generally shown as $SDI_x$. $SDI_x$ may be any of the inputs $SDI_1$, $SDI_2$, $SDI_3$, or $SDI_4$. The reducing unit has four flops including a first flop ($F_1$) 402, a second flop ($F_2$) 404, a third flop ($F_3$) 408, and a fourth flop ($F_4$) 410. The reducing unit utilizes the four flops to output even data on the even output (Even) 412 and odd data on the odd output (Odd) 414. Therefore the double data rate input provided on $SDI_x$ is reduced to two single data rate outputs Even 412 and Odd 414.

Each flop includes an input (In), an output (Out), and an enable (En). Upon receiving a high signal on the enable, the flop samples the input and holds the sampled value on the output until the input is sampled again. The SCI 302 provides signals to the enable (En) of each of the four flops. For example, the SCI 302 is provided to the enable of the first flop 402 such that when the SCI 302 is low the enable is not selected and the input (In) is not sampled. When the SCI 302 is high, the enable of the first flop 402 is selected and the input (In) is sampled.

The second flop 404 includes an inverse 406 on the input to the enable. The inverse 406 outputs the opposite signal than is input to the inverse 406. For example, when the SCI 302 is high, then the inverse 406 provides a low signal to the enable of the second flop 404. Similarly, when the SCI 302 is low, then the inverse 406 provides a high signal to the enable of the second flop 404. Therefore, when the SCI 302 is low the enable of the second flop 404 is selected and the input (In) is sampled. When the SCI 302 is high, the enable of the second flop 404 is selected and the input (In) is not sampled.

Figure 5:
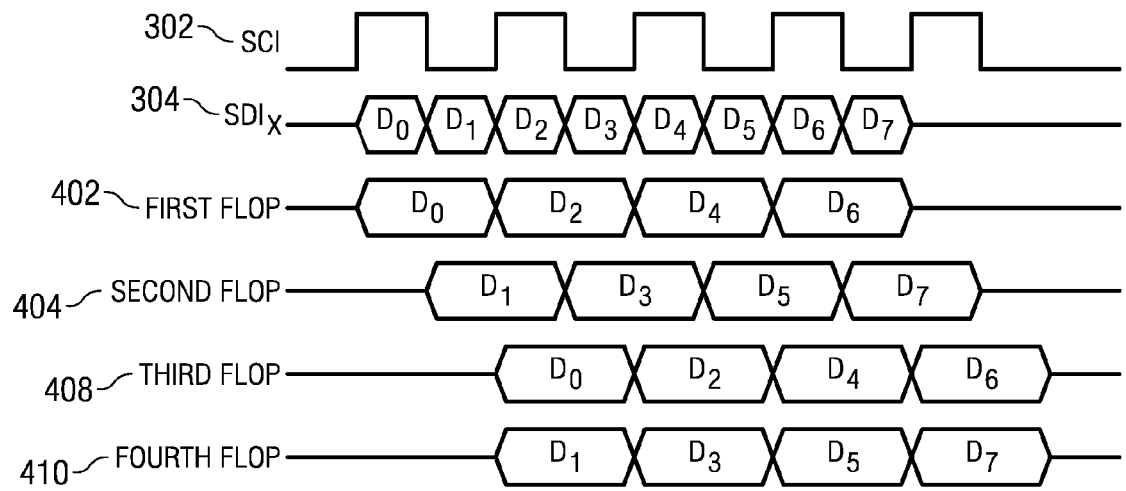
FIG. 5 illustrates an exemplary timing diagram of the reducing unit according to an embodiment of the disclosure.

FIG. 5 illustrates an exemplary timing diagram of the reducing unit according to an embodiment of the disclosure. The timing diagram includes the inputs to the reducing unit the SCI 302 and the $SDI_x$, the inputs to the first flop 402 and the second flop 404, and the outputs of the third flop 406 and the fourth flop 408. As discussed above, a bit of data is received on $SDI_x$ for each phase of the SCI 302. For example, data bit $D_0$ is received on $SDI_x$ when the SCI 302 is high, data bit $D_1$ is received on $SDI_x$ when the SCI 302 is low, and so on. In general, the even numbered data bits are received when the SCI 302 is high and the odd numbered data bits are received when the SCI 302 is low.

The first flop 402 samples the data on $SDI_x$ when the SCI 302 is high and the second flop 402 samples the data on $SDI_x$ when the SCI 302 is low. For example, the first flop 402 samples data bit D0 when the SCI 302 is high and the second flop 404 samples the data bit D1 when the SCI 302 is low. The third flop 408 and the fourth flop 410 both sample the data on the output of the first flop 402 and the second flop 404, respectively, when the SCI 302 is high. For example, the third flop 408 samples the output of the first flop 402 and the fourth flop 410 simultaneously samples the output of the second flop 404 when the SCI 302 is high.

Figure 6:
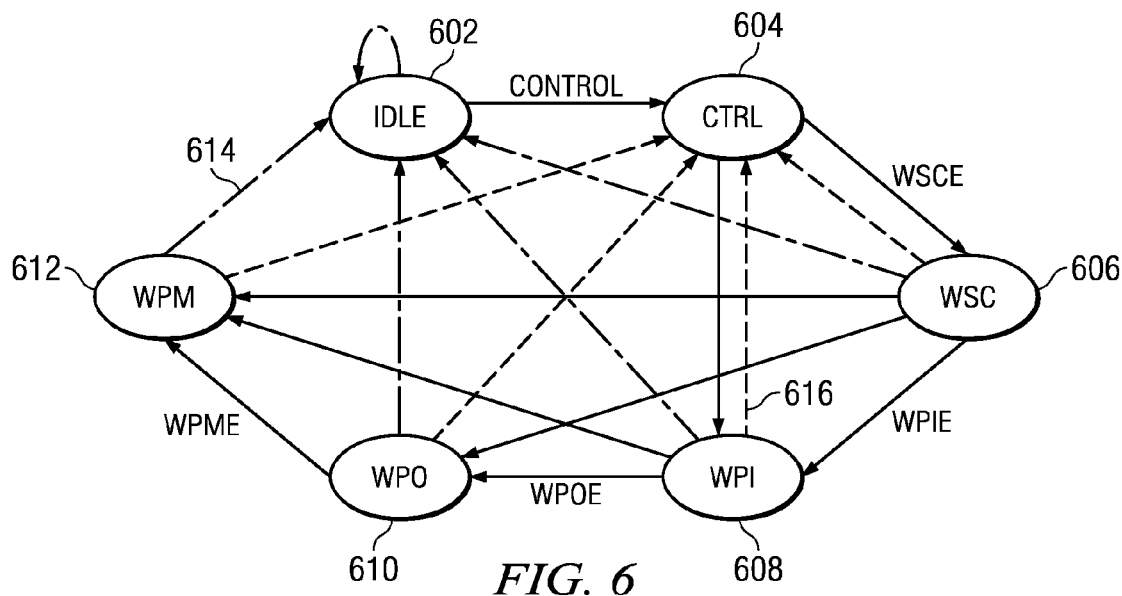
FIG. 6 illustrates exemplary finite state machine of the test protocol manager according to an embodiment of the disclosure.

FIG. 6 illustrates an exemplary finite state machine of the FSM unit 312 according to an embodiment of the disclosure. The finite state machine illustrated in FIG. 6 depicts the operation of the FSM unit 312 in the functional mode of the TPM 202. The finite state machine includes an idle (IDLE) state 602, a control (CTRL) state 604, a wrapper serial control (WSC) state 606, a wrapper parallel input (WPI) state 608, a wrapper parallel output (WPO) state 610, and a wrapper parallel mask (WPM) state 612. Transitions from any of the states listed above to the IDLE state 602 are shown with a line 614 having a dash-dot pattern. Transitions from any of the states listed above to the control state are shown with a line 616 having a dashed pattern. The finite state machine may be traversed in accordance with the byte of data received from the reducing units 310 during each beat of the SCI 302.

Table 5 shows how the FSM unit 312 decodes the byte of data received from the reducing units 310 during each beat of the SCI 302. As discussed above, each beat of the SCI 302 has two phases, wherein four bits of data are received over the SDI 304 during each of the phases of the SCI 302.

TABLE 5

| State | SCI Phase | 1<br>0 | SDI₄ (D7)<br>SDI₄ (D3) | SDI₃ (D6)<br>SDI₃ (D2) | SDI₂ (D5)<br>SDI₂ (D1) | SDI₁ (D4)<br>SDI₁ (D0) |
|---|---|---|---|---|---|---|
| IDLE | | 1 | 0 | 0 | 0 | 0 |
| | | 0 | 0 | 0 | 0 | 0 |
| CTRL | | 1 | WSCE | WPIE | WPOE | WPME |
| | | 0 | NRESET | WRCKEN | WRSTN | PARITY |
| WSC | | 1 | SELECTWIR | SHIFTWR | UPDATEWR | CAPTUREWR |
| | | 0 | WSI | WSO | WSM | FRAME |
| WPI | | 1 | WPI[7] | WPI[6] | WPI[5] | WPI[4] |
| | | 0 | WPI[3] | WPI[2] | WPI[1] | WPI[0] |
| WPO | | 1 | WPO[7] | WPO[6] | WPO[5] | WPO[4] |
| | | 0 | WPO[3] | WPO[2] | WPO[1] | WPO[0] |
| WPM | | 1 | WPM[7] | WPM[6] | WPM[5] | WPM[4] |
| | | 0 | WPM[3] | WPM[2] | WPM[1] | WPM[0] |

The first column of Table 5 indicates the current state in the finite state machine of FIG. 6. The second column of Table 5 indicates which phase the SCI 302 is in. Each of the third through sixth columns of Table 5 indicates data received over the SDI 304 during both phases of the SCI 302. Specifically, each of the third through sixth columns of Table 5 indicates a decoding of the byte of data received over SDI₄, SDI₃, SDI₂, and SDI₁, respectively, during each beat of the SCI 302. For example, when the SCI 302 is low, data bits D0, D1, D2, and D3 are received over SDI₁, SDI₂, SDI₃, and SDI₄, respectively. When SCI 304 is high, data bits D4, D5, D6, and, D7 are received over SDI₁, SDI₂, SDI₃, and SDI₄, respectively.

Each row of Table 5 corresponds with a different state of the finite state machine shown in FIG. 6. Each row of Table 5 has a corresponding pair of rows, one for each of the two phases of the SCI 302. The phases of the SCI 302 are shown as "1" when the SCI 302 is high and "0" when the SCI 302 is low. The corresponding pair of rows indicates how the FSM unit 312 interprets the byte of data including data bits D0-D7 received over the SDI 304. For example, in the pair of rows corresponding to the CTRL state 604 the data bits D0-D3 received over SDI₁, SDI₂, SDI₃, and SDI₄ when the SCI 302 is low are interpreted as a PARITY bit, a WRSTN bit, a WRCKEN bit, and a NRESET bit, respectively. Similarly, the data bits D4-D7 received over SDI₁, SDI₂, SDI₃, and SDI₄ when the SCI 302 is high are interpreted as a WPME bit, a WPOE bit, a WPIE bit, and a WSCE bit.

In operation, the FSM unit 312 starts in the IDLE state 602. The FSM unit 312 may remain in the IDLE state 602 until any non-zero bits are received on the upper nibble data bits D4-D7. Upon receiving a non-zero bit on any of the upper nibble data bits D4-D7, the FSM unit 312 enters the CTRL state 604.

In the CTRL state 604, the FSM unit 312 interprets the upper nibble data bits D7-D4 as a WSC execute (WSCE) bit, a WPI execute (WPIE) bit, a WPO execute (WPOE) bit, and a WPM execute (WPME) bit, respectively. Based on how these bits are set, the FSM unit 312 determines how it will traverse the next one to four states of the finite state machine shown in FIG. 6. For example, if the upper nibble data bits D7-D4 are "1000", then the FSM unit 312 transitions from the CTRL state 604 to the WSC state 606 and back to either the IDLE state 602 or the CTRL state 604. Similarly, if the upper nibble data bits D7-D4 are "0111", then the FSM unit 312 transitions from the CTRL state 604 to each of the WPI state 608, the WPO state 610, and the WPM state 612 in that order. After traversing each of these states the FSM unit 312 may transition back to either the IDLE state 602 or the CTRL state 604.

Upon traversing each of the states as governed by the CTRL state 604, the FSM unit 312 may communicate a packet of data over the TAM 204 via the IEEE 1500 master interface 326. The packet of data may include data received during one or more of the states and formatted in accordance with the IEEE 1500 standard as governed by the FSM unit 312. That is, each packet of data may include information received from the ATE 102 during one to five beats of the SCI 302. The communication of a packet of data is referred to herein as a transfer. The FSM unit 312 transitions to either the IDLE state 602 or the CTRL state 604 upon initiating a transfer. Therefore each of the lines 614 and the lines 616 in the finite state machine of FIG. 6 are indicative of a transfer.

Depending on the bits received on the upper nibble data bits D7-D4 after traversing each of the states as governed by the CTRL state 604, the FSM unit 312 transitions to either the IDLE state 602 or the CTRL state 604. If any of the upper nibble data bits D7-D4 are non-zero bits, then the FSM unit 312 transitions to the CTRL state 604. If all of the upper nibble data bits D7-D4 are zero, then the FSM unit transitions to the IDLE state 602.

In the CTRL state 604, the FSM unit 312 interprets the lower nibble data bits D3-D0 as a normal reset (NREST) bit, a wrapper clock enable (WRCKEN) bit, a wrapper reset (WRSTN) bit, and a parity (PARITY) bit. As discussed above, each of the cores in the digital IP 118 may include a wrapper that isolates the core from the SoC environment such that each core may be independently tested. Each wrapper may include a wrapper instruction register (WIR) that controls the operation of the wrapper, a wrapper serial input (WSI) for inputting data into the wrapper, and a wrapper serial output (WPO) for reading data out of the wrapper. Setting the NRESET bit may cause a normal reset of a core in the digital IP 118. Setting the WRCKEN bit may cause the clock unit 322 to pulse the WRCK line on the IEEE master interface 326. Setting the WRSTN bit may cause an IEEE 1500 wrapper to be reset by resetting the WIR. The PARITY bit may be used to maintain even parity for the packets communicated to the FSM unit 312 from the ATE 102. If the bits of data comprising a packet have an even parity then the PARITY bit may be set to zero. Similarly, if the bits of data comprising a packet have an odd parity then the PARITY bit may be set to one to maintain an even parity.

In the WSC state 606, the FSM unit 312 interprets the upper nibble data bits D7-D4 as a select wrapper input register (SELECTWIR) bit, a shift wrapper register (SHIFTWR) bit, an update wrapper register (UPDATEWR) bit, and a capture wrapper register (CAPTUREWR) bit. The SELECTWIR bit may select that the WSI to a core is shifted directly through the WIR to the WSO of the core. The SHIFTWR bit may cause a single bit of data to be shifted from the WSI of a core to the WIR of the core. The UPDATEWR bit may determine the active modes of a wrapper to ensure that modes of the wrapper do not wiggle during WIR shift operations. The CAPTUREWR bit may cause a parallel capture of control information into the WIR of a core. Also, in a CTRL-WSC state traversal, when the CAPTUREWR bit is asserted the transmit unit 318 may read out data from the memory 316 for communication to the ATE 102.

In the WSC state 606, the FSM unit 312 interprets the lower nibble data bits D3-D0 as a wrapper serial input (WSI) bit, a wrapper serial output (WSO) bit, a wrapper serial mask (WSM) bit, and a frame (FRAME) bit. The WSI bit provides input data to the WSI of a wrapper. The WSO bit provides an expected test responses. As described above, the expected test response may be supplied to the compare unit 314. The WSM bit is a mask bit that dictates whether or not a comparison is masked. The FRAME bit may indicate the start and end of a scan chain. For example, the FRAME bit transitioning from zero to one may indicate the start of a scan chain. While the FRAME bit remains one in subsequent packets received from the ATE 102, the scan chain continues. The FRAME bit transitioning back to zero may indicate the end of a scan chain.

Each of the WPI state 608, the WPO state 610, and the WPM state 612 operate in a similar manner as the WSI, WSO, and WSM bits described above. The WPI state 608 provides eight bits of parallel input to wrappers on the DUT 106. The WPO state 610 provides eight bits of parallel expected test responses from wrappers on the DUT 106. The WPM state 612 provides eight mask bits indicating whether or not to perform comparisons of test responses to the WPI bits.

FIG. 7 illustrates an exemplary implementation of the transmit unit 318 according to an embodiment of the disclosure. The transmit unit 318 may include a parity calculator 702 and a data formatter 704. The transmit unit 318 may receive inputs from the memory 316 and the reducing units 310. The transmit unit 318 may generate outputs on the uplink communication of the ATE-to-DUT interface 110. Looking back to FIG. 3, the TPM 202 may use the transmit unit 318 to send data on the SCO 308 and the SDO 306. The data formatter 704 may format the output on the SDO 306 and the SCO 308 to enable communication with the ATE 102.

The parity calculator 702 may receive inputs from the reducing units 310 to check for even parity of packets communicated from the ATE 102. If the parity calculator 702 detects that a packet has an odd parity, then an error in the communication between the ATE 102 and the TPM 202 may have occurred. Upon detecting odd parity in a packet, the parity calculator 702 may log an occurrence of odd parity in the memory 316 or the parity calculator 702 may notify the ATE 102 of the error through a heartbeat parity communication.

Figure 8:
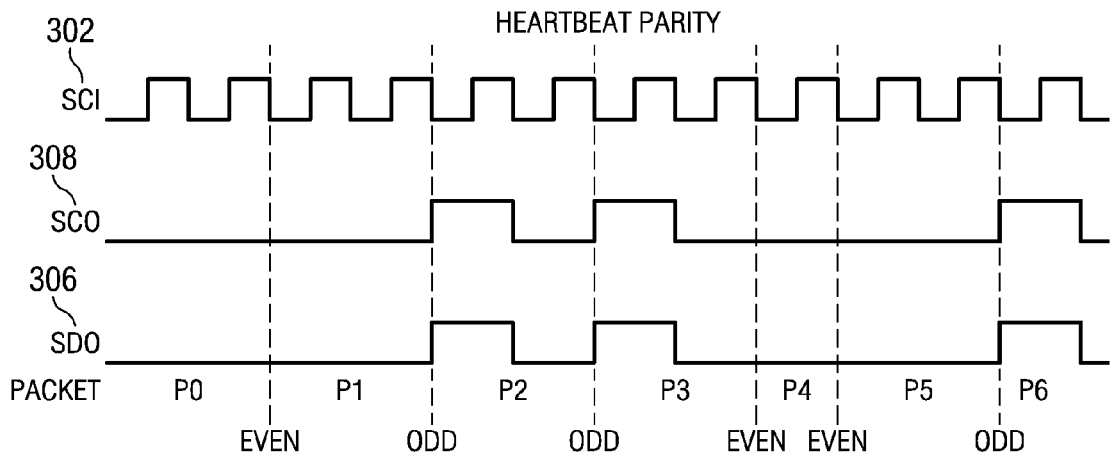
FIG. 8 illustrates an exemplary timing diagram of a heartbeat parity output from the test protocol manager according to an embodiment of the disclosure.

FIG. 8 illustrates an exemplary timing diagram of the heartbeat parity that may be communicated by the transmit unit 318 to notify the ATE 102 of communication errors. The heartbeat parity may be communicated by the parity calculator 702 over SDO 306 and SCO 308 to the ATE 102. As discussed above in conjunction with FIG. 6, each packet of data in a transfer may include data received from the ATE 120 over one to five beats of the SCI 302.

The exemplary timing diagram of the heartbeat parity includes the SCI 302 and the outputs generated on the SDO 306 and SCO 308 when even and odd parity are detected on packets P0 through P6. When the parity calculator 702 detects even parity, SDO 306 and SCO 308 both maintain a zero output. Upon detecting that a packet has odd parity, the parity calculator 702 may strobe pulse SDO 306 and SCO 308. For example, the parity calculator 702 may detect that packet P1 has odd parity. Upon detecting the odd parity, the parity calculator 702 may pulse SDO 306 and SCO 308. As illustrated, packets P1, P2, and P5 each have odd parity.

Figure 9:
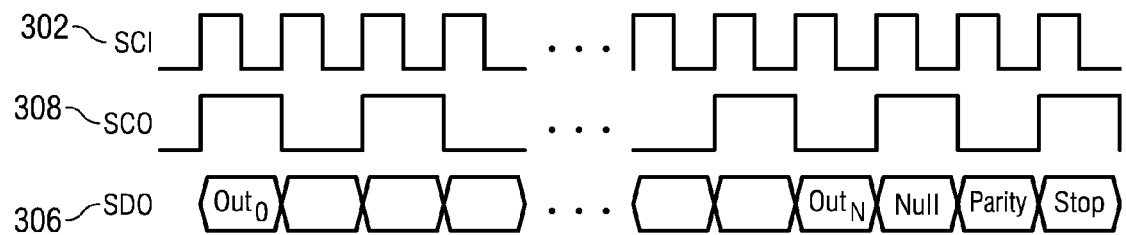
FIG. 9 illustrates an exemplary timing diagram of data output from the test protocol manager according to an embodiment of the disclosure.

FIG. 9 illustrates an exemplary timing diagram of data output from the memory 316 by the transmit unit 318. The exemplary timing diagram of the data output includes the SCI 302 and the outputs generated on the SDO 306 and SCO 308. As discussed above, when the CAPTUREWR bit is asserted in a CTRL-WSC state traversal, the transmit unit 318 may read out data from the memory 316 for communication to the ATE 102. Also discussed above, the transmit unit 318 may begin reading data from the memory 316 at an address pointed to by Address 1. Each bit in the line of the memory 316 pointed to by Address 1 may be read out from the memory 316 starting from the least significant bit and serially communicated to the ATE 102 over SDO 306. Address 1 may be incremented upon reading all of the data of the line of the memory 316 pointed to by Address 1. The transmit unit 318 may continue to read data from the memory 316 until Address 1 is equal to Address 2.

As shown in FIG. 9, SCO 308 may be a clock signal that is half the frequency of SCI 302. Alternatively, SCO 308 may be clocked at the same frequency as SCI 302 or SCI 302 may be directly tied to SCO 308 to provide the output clock. SCO 308 is illustrated as a double data rate clock that communicates data on SDO 308 on each phase of SCO 308. Each bit of data read out from the memory 316 may be communicated by SDO 306 on each phase of SCO 308. A NULL bit may be appended to the stream of output data on SDO 306 to maintain an even number of bits in the output data stream. For example, if the output data stream includes an odd number of bits then the NULL bit may be set to zero and appended to the end of the output data stream. A PARITY bit may follow the NULL bit to ensure that the output data stream maintains even parity. For example, if the output data stream has an odd parity then the PARITY bit may be asserted to ensure that the output data stream has an even parity. A STOP bit set to zero may follow the PARITY bit to mark the end of the output data stream.

While the transmit unit 318 was described above as providing a heartbeat parity or reading out data from the memory 316 to the ATE 102, the transmit unit 318 may also operate in a bypass access mode. In the bypass access mode, the transmit unit 318 may directly output data from the IEEE master interface 326 to the SDO 306. In particular, the transmit unit 318 may directly output the WPO[7:0] and the WSO, just the WPO[7:0], or just the WSO received from the IEEE master interface 326. Various formats of the data output on the SDO 306 in the bypass access mode are shown in Table 6.

TABLE 6

| BTYPE[1:0] | SDO 306 Output Sequence |
|---|---|
| 00 | WPO[0], . . . WPO[7], WSO, NULL, PARITY, STOP |
| 01 | WPO[0], . . . WPO[7], PARITY, STOP |
| 10 | WSO, NULL, PARITY, STOP |

The first column of Table 6 includes a bypass access type (BTYPE[1:0]) field that identifies the format of data to be output over SDO 306 in the bypass access mode. The second column of Table 6 indicates the sequence of communication for communicating data from the IEEE 1500 master interface 326 over the SDO 306.

A first format of data that may be used to output data over SDO 306 in the bypass access mode is indicated by the BTYPE[1:0] field having a value of "00". As shown in the second column of Table 6, the sequence of communication includes communicating each of the WPO[7:0] bits received on the IEEE 1500 master interface 326 in order from the least significant WPO[7:0] bit to the most significant WPO[7:0] bit. Following the WPO[7:0] bits, the first format communicates the WSO bit received on the IEEE 1500 master interface 326. Because the output data sequence of the first format includes an odd number of bits, namely nine bits, the output data sequence is appended with a NULL bit. Following the NULL bit is a PARITY bit and a STOP bit as described above.

A second format of data that may be used to output data over SDO 306 in the bypass access mode is indicated by the BTYPE[1:0] field having a value of "01". As shown in the second column of Table 6, the sequence of communication includes communicating each of the WPO[7:0] bits received on the IEEE 1500 master interface 326 in order from the least significant WPO[7:0] bit to the most significant WPO[7:0] bit. Because the output data sequence of the second format includes an even number of bits, namely eight bits, the output data sequence, a NULL bit is not needed. Following the output data sequence is a PARITY bit and a STOP bit as described above.

A third format of data that may be used to output data over SDO 306 in the bypass access mode is indicated by the BTYPE[1:0] field having a value of "01". As shown in the second column of Table 6, the sequence of communication includes communicating the WSO bit received on the IEEE 1500 master interface 326. Because the output data sequence of the third format includes an odd number of bits, namely one bit, the output data sequence is appended with a NULL bit. Following the NULL bit is a PARITY bit and a STOP bit as described above.

As discussed above, the TAM 204 may receive test stimulus from the TPM 202 over the IEEE 1500 master interface 326. The TAM 204 provides interfaces for communicating the test stimulus to some or all of the cores in the digital IP 118 and some or all of the IEEE 1500 wrappers 206 corresponding with the analog IP 120. The TAM 204 may be implemented in accordance with the IEEE 1500 standard.

Figure 10:
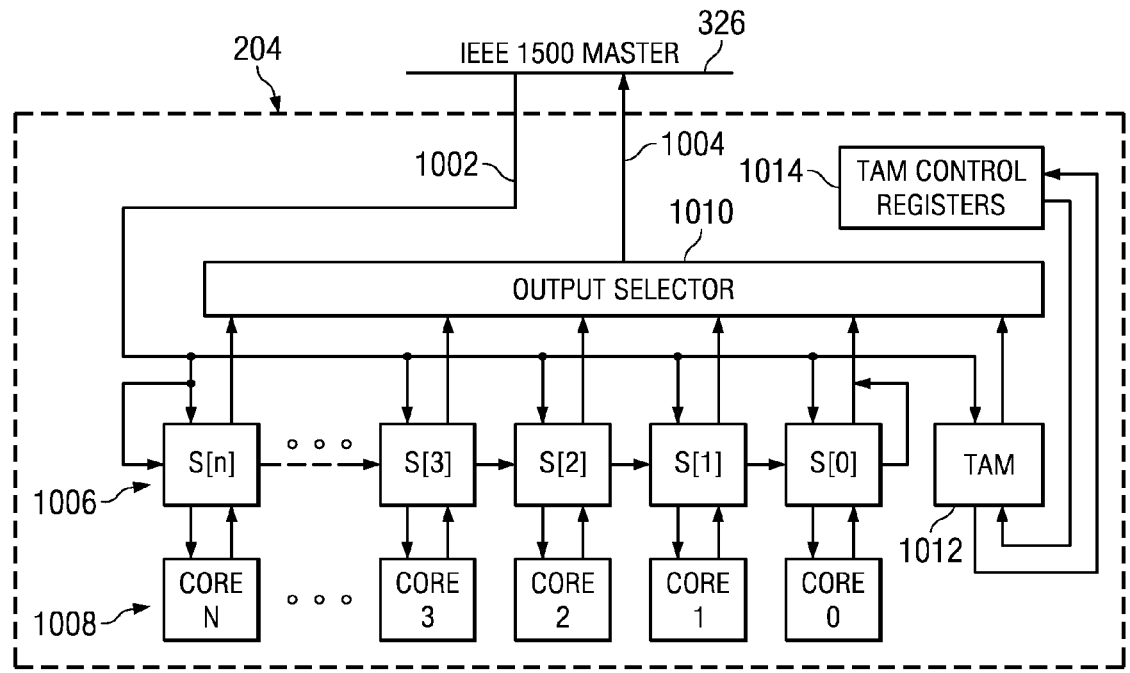
FIG. 10 illustrates an exemplary test access mechanism according to an embodiment of the disclosure.

FIG. 10 illustrates an exemplary implementation of the TAM 204 according to an embodiment of the disclosure. The TAM 204 may receive test stimulus over an input 1002 from the IEEE 1500 master interface 326 and send test responses over an output 1004 to the IEEE 1500 master interface 326. The input 1002 may provide input to a plurality of slave interfaces 1006. The slave interfaces 1006 include a slave interface S[0], a slave interface S[1], a slave interface S[2], a slave interface S[3], and a slave interface S[n]. Each of the slave interfaces 1006 may provide test stimulus to a plurality of cores 1008, another of the slave interfaces 1006, or an output selector 1010. Similarly, each of the slave interfaces 1006 may provide test responses to another of the slave interfaces 1006 or the output selector 1010. The plurality of cores 1008 includes a core 0, a core 1, a core 2, a core 3, and a core N. Each of the plurality of cores 1008 may communicate with a corresponding one of the slave interfaces 1006.

The output selector 1010 may select test responses from one or more of the slave interfaces 1006 and communicate the test responses on the output 1004 to the IEEE 1500 master interface 326. In an embodiment, the output selector may be implemented as an exclusive OR logical network. A test access mechanism (TAM) 1012 may receive inputs from the input 1002 for programming TAM control registers 1014. The TAM 1012 may use the programmed control registers 1014 to control the operation of the TAM 204.

Figure 11:
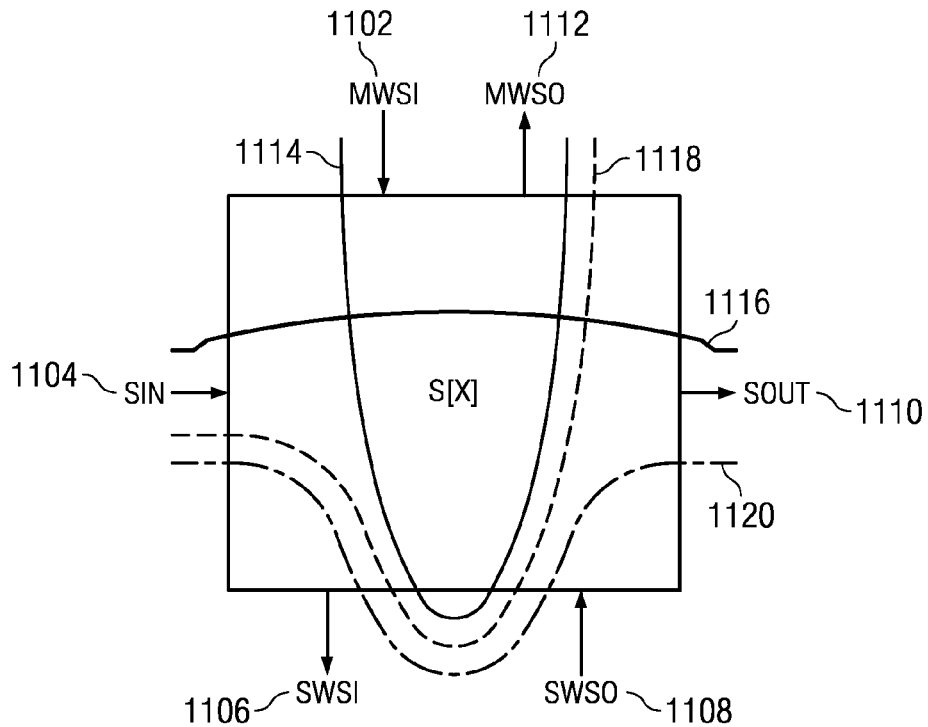
FIG. 11 illustrates an exemplary slave interface of the test access mechanism according to an embodiment of the disclosure.

FIG. 11 illustrates an exemplary implementation of one of the slave interfaces 1004 according to an embodiment of the disclosure. The exemplary one of the slave interfaces 1004, S[X], includes a master wrapper serial input (MWSI) 1102, a slave input (SIN) 1104, a slave wrapper serial input (SWSI) 1106, a slave wrapper serial output (SWSO) 1108, a slave output (SOUT) 1110, and a master wrapper serial output (MWSO 1112.

The MWSI 1102 provides an input to the slave interface S[X] from the input 1002. The SIN 1104 provides an input to the slave interface S[X] from an adjacent slave interface. On slave interface S[n] the MWSI 1102 and the SIN 1104 may be tied together. The SWSI 1106 provides test stimulus from input to the slave interface S[X] to a corresponding core. The SWSO 1108 receives test responses output from the corresponding core in response to the test stimulus. The SOUT 1110 sends test stimulus or test responses to an adjacent slave interface. On slave interface S[0] the SOUT 1102 and the MWSO 1112 may be tied together. The MWSO 1112 may send test stimulus or test responses to the output selector 1010.

Each of the slave interfaces 1006 may operate in one of a plurality of modes. Table 7 shows exemplary modes of operation in which each of the slave interfaces 1006 may operate.

TABLE 7

| Mode | Path | Bypass | Local Outputs | | |
| --- | --- | --- | --- | --- | --- |
| | | | MWSO | SWSI | SOUT |
| Direct | 0 | 0 | SWSO | MWSI | SWSO |
| Bypass | 0 | 1 | MWSI | MWSI | SIN |
| Serial | 1 | 0 | MWSI | SIN | SWSO |
| Observe | 1 | 1 | SWSO | SIN | SWSO |

The first column of Table 7 indicates the mode that one of the slave interfaces 1006 is operating in. For example, the second row of Table 7 indicates how the slave interfaces 1006 operate in a direct mode. The second column of Table 7 indicates whether the corresponding mode is operating in a path. For example, the second row of Table 7 indicates that the direct mode does not operate in a path. A path may link together a chain of a plurality of the slave interfaces 1006. Paths may be linked together as serial paths or parallel paths. Serial paths may link together a plurality of the slave interfaces 1006 during data operations of the TAM 204. Parallel paths may link together a plurality of the slave interfaces 1006 during data and instruction operations of the TAM 204. The third column of Table 7 indicates whether the corresponding mode is operating as a bypass. For example, the second row of Table 7 indicates that the direct mode does not operate as a bypass. A bypass may enable the slave interface S[X] to directly forward along data from its inputs. The fourth through sixth columns of Table 7 indicate how the slave interface S[X] routes its inputs and outputs.

In the direct mode, the SWSI 1106 may provide data supplied by the MWSI 1102 to the corresponding core. The MWSO 1112 may provide data received from the SWSO 1108 to the output selector 1010. The SOUT 1110 may provide the data received from the SWSO 1108 to an adjacent slave interface. The path of data through the slave interface S[X] in the direct mode is shown by the solid line 1114.

In the bypass mode, the SWSI 1106 may provide data supplied by the MWSI 1102 to the corresponding core. The MWSO 1112 may provide the data supplied by the MWSI 1102 to the output selector 1010. The SOUT 1110 may provide the data supplied by the SIN 1104 to an adjacent slave interface. The bypass mode may include a delay provided by a flop and a latch on the slave interface S[X]. The path of data through the slave interface S[X] in the bypass mode is shown by the bold line 1116.

In the serial mode, the SWSI 1106 may provide data supplied by the SIN 1104 to the corresponding core. The MWSO 1112 may provide data supplied by the MWSI 1102 to the output selector 1010. The SOUT 1110 may provide the data supplied by the SWSO 1108 to an adjacent slave interface. The path of data through the slave interface S[X] in the serial mode is shown by the dashed line 1118.

In the observe mode, the SWSI 1106 may provide data supplied by the SIN 1104 to the corresponding core. The MWSO 1112 may provide data supplied by the SWSO 1108 to the output selector 1010. The SOUT 1110 may provide the data supplied by the SWSO 1108 to an adjacent slave interface. The path of data through the slave interface S[X] in the serial mode is shown by the line 1120 with a dash-dot pattern.

Figure 12:
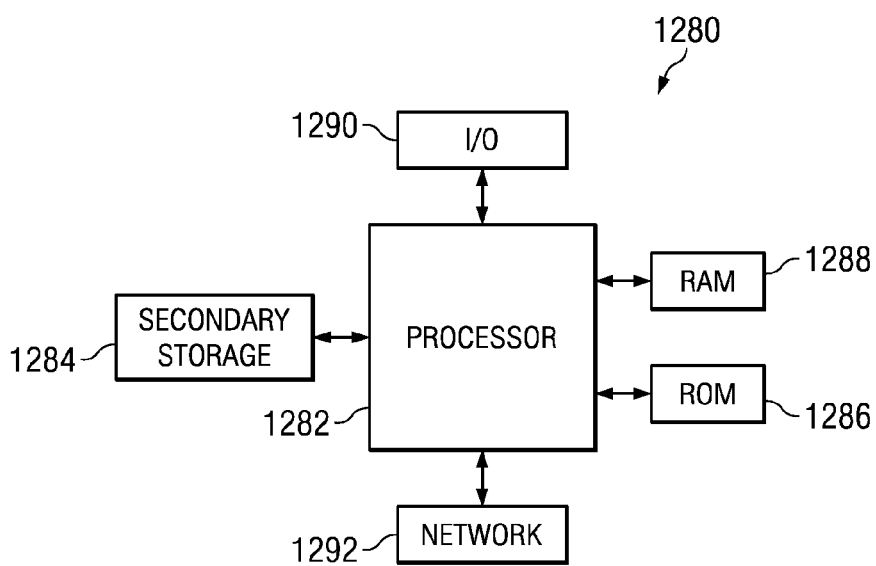
FIG. 12 illustrates an exemplary general purpose computer system suitable for implementing the several embodiments of the disclosure.

The ATE system described above may be implemented on any general-purpose computer with sufficient processing power, memory resources, and network throughput capability to handle the necessary workload placed upon it. FIG. 12 illustrates a typical, general-purpose computer system suitable for implementing one or more embodiments disclosed herein. The computer system 1280 includes a processor 1282 (which may be referred to as a central processor unit or CPU) that is in communication with memory devices including secondary storage 1284, read only memory (ROM) 1286, random access memory (RAM) 1288, input/output (I/O) 1290 devices, and network connectivity devices 1292. The processor may be implemented as one or more CPU chips.

The secondary storage 1284 is typically comprised of one or more disk drives or tape drives and is used for non-volatile storage of data and as an over-flow data storage device if RAM 1288 is not large enough to hold all working data. Secondary storage 1284 may be used to store programs which are loaded into RAM 1288 when such programs are selected for execution. The ROM 1286 is used to store instructions and perhaps data which are read during program execution. ROM 1286 is a non-volatile memory device which typically has a small memory capacity relative to the larger memory capacity of secondary storage. The RAM 1288 is used to store volatile data and perhaps to store instructions. Access to both ROM 1286 and RAM 1288 is typically faster than to secondary storage 1284.

I/O 1290 devices may include printers, video monitors, liquid crystal displays (LCDs), touch screen displays, keyboards, keypads, switches, dials, mice, track balls, voice recognizers, card readers, paper tape readers, or other well-known input devices. The network connectivity devices 1292 may take the form of modems, modem banks, ethernet cards, universal serial bus (USB) interface cards, serial interfaces, token ring cards, fiber distributed data interface (FDDI) cards, wireless local area network (WLAN) cards, radio transceiver cards such as code division multiple access (CDMA) and/or global system for mobile communications (GSM) radio transceiver cards, and other well-known network devices. These network connectivity 1292 devices may enable the processor 1282 to communicate with an Internet or one or more intranets. With such a network connection, it is contemplated that the processor 1282 might receive information from the network, or might output information to the network in the course of performing the above-described method steps. Such information, which is often represented as a sequence of instructions to be executed using processor 1282, may be received from and outputted to the network, for example, in the form of a computer data signal embodied in a carrier wave.

Such information, which may include data or instructions to be executed using processor 1282 for example, may be received from and outputted to the network, for example, in the form of a computer data baseband signal or signal embodied in a carrier wave. The baseband signal or signal embodied in the carrier wave generated by the network connectivity 1292 devices may propagate in or on the surface of electrical conductors, in coaxial cables, in waveguides, in optical media, for example optical fiber, or in the air or free space. The information contained in the baseband signal or signal embedded in the carrier wave may be ordered according to different sequences, as may be desirable for either processing or generating the information or transmitting or receiving the information. The baseband signal or signal embedded in the carrier wave, or other types of signals currently used or hereafter developed, referred to herein as the transmission medium, may be generated according to several methods well known to one skilled in the art.

The processor 1282 executes instructions, codes, computer programs, scripts which it accesses from hard disk, floppy disk, optical disk (these various disk based systems may all be considered secondary storage 1284), ROM 1286, RAM 1288, or the network connectivity devices 1292.

While several embodiments have been provided in the disclosure, it should be understood that the disclosed systems and methods may be embodied in many other specific forms without departing from the spirit or scope of the disclosure. The examples are to be considered as illustrative and not restrictive, and the intention is not to be limited to the details given herein. For example, the various elements or components may be combined or integrated in another system or certain features may be omitted, or not implemented.

While the TPM 202 and the TAM 204 were described above as operating in accordance with the IEEE 1500 standard one skilled in the art will recognize that the systems and methods described above may be used in conjunction with any SoC testing interface or a combination of SoC testing interfaces. For example, the TPM 202 and the TAM 204 may operate in accordance with the IEEE 1149.1 standard. In another example, the TPM 202 and TAM 204 may communicate via an X16 very low cost test (VLCT) interface. Also, while the description above indicated that more bandwidth may be allocated for downlink communication than for uplink communication, one skilled in the art will recognize that any allocation of bandwidth for uplink communication and downlink communication may be used. For example, bandwidth may be evenly allocated between downlink communication and uplink communication or more bandwidth may be allocated for uplink communication than for downlink communication. Further, while particular bit assignments were described above, one skilled in the are will recognize that an assignment of a particular value of a bit to a particular interpretation of that bit is arbitrary and may be modified as needed.

Also, techniques, systems, subsystems and methods described and illustrated in the various embodiments as discrete or separate may be combined or integrated with other systems, modules, techniques, or methods without departing from the scope of the disclosure. Other items shown or discussed as coupled or directly coupled or communicating with each other may be indirectly coupled or communicating through some interface, device, or intermediate component whether electrically, mechanically, or otherwise. Other examples of changes, substitutions, and alterations are ascertainable by one skilled in the art and could be made without departing from the spirit and scope disclosed herein.

What is claimed is:

1. A device under test, comprising:
   a digital intellectual property design including a plurality of cores;
   an interface configured to receive test stimulus from a downlink communication, provide the test stimulus to one or more of the plurality of cores, and send test data on an uplink communication; wherein the interface is further configured to receive expected test responses via the downlink communication;
   a comparison unit configured to generate test comparisons based on test responses provided by the one or more of the plurality of cores and expected test responses;
   a built-in self test controller configured to perform tests of one or more components of the device under test and generate the diagnostic data in accordance with the tests; and
   a memory configured to store the test comparisons and the diagnostic data, wherein the test data includes the test comparisons and the diagnostic data.

2. The device under test of claim 1, further comprising:
   a plurality of built-in self test controllers, each configured to perform tests of one or more components of the device under test and generate the diagnostic data in accordance with the tests.

3. The device under test of claim 1, wherein the downlink communication and the uplink communication are asymmetric.

4. The device under test of claim 3, wherein a bandwidth of the downlink communication is greater than a bandwidth of the uplink communication.

5. The device under test of claim 1, wherein the interface is further configured to receive a request for the test data, and
   wherein the interface is further configured to send the test data on the uplink communication in response to receiving the request.

6. The device under test of claim 1, wherein the diagnostic data includes data that identifies a component of the one or more components that has failed one of the tests.

7. An integrated circuit device, comprising:
   a plurality of cores;
   an interface configured to receive test stimulus from a downlink communication, for providing test stimulus to one or more of the plurality of cores, for sending test data on an uplink communication, and for receiving expected test responses via the downlink communication;
   a comparison unit configured for generating test comparisons based on the test responses and the expected test responses;
   a built-in self test controller configured for performing tests on one or more components of the device and for generating diagnostic data in accordance with the tests; and
   a memory configured for storing the test comparisons and the diagnostic data.

8. The device under test of claim 7, further comprising:
   a plurality of built-in self test controllers, each configured for performing tests of one or more components of the device and for generating diagnostic data in accordance with the tests.

9. The device under test of claim 7, wherein the downlink communication and the uplink communication are asymmetric.

10. The device under test of claim 9, wherein the uplink communication has a first bandwidth and the downlink communication has a second bandwidth greater than the first bandwidth.

11. The device under test of claim 7, wherein the interface is further configured for receiving a request for the test data, and for sending the test data on the uplink communication in response to receiving the request.

12. The device under test of claim 7, wherein the diagnostic data include information identifying whether a component of the device failed a test.

* * * * *